(12) United States Patent
Yang

(10) Patent No.: US 11,758,811 B2
(45) Date of Patent: Sep. 12, 2023

(54) THERMOELECTRIC MODULE

(71) Applicant: LG INNOTEK CO., LTD., Seoul (KR)

(72) Inventor: Tae Su Yang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 96 days.

(21) Appl. No.: 17/270,163

(22) PCT Filed: Sep. 10, 2019

(86) PCT No.: PCT/KR2019/011726
§ 371 (c)(1),
(2) Date: Feb. 22, 2021

(87) PCT Pub. No.: WO2020/055100
PCT Pub. Date: Mar. 19, 2020

(65) Prior Publication Data
US 2021/0202819 A1 Jul. 1, 2021

(30) Foreign Application Priority Data

Sep. 11, 2018 (KR) ........................ 10-2018-0108449

(51) Int. Cl.
*H10N 10/17* (2023.01)
*H10N 10/80* (2023.01)

(52) U.S. Cl.
CPC ............. *H10N 10/17* (2023.02); *H10N 10/80* (2023.02)

(58) Field of Classification Search
CPC ......... H01L 35/02; H01L 35/32; H10N 10/17; H10N 10/80
See application file for complete search history.

(56) References Cited

U.S. PATENT DOCUMENTS

| 3,095,709 | A | * | 7/1963 | Demand | ................. | F25B 21/02 |
| | | | | | | 136/235 |
| 3,150,300 | A | * | 9/1964 | Schils | ...................... | H01G 4/32 |
| | | | | | | 361/308.2 |

(Continued)

FOREIGN PATENT DOCUMENTS

| JP | 2000188430 A | * | 7/2000 | ............. H01L 35/32 |
| KR | 10-0620913 | | 9/2006 | |

(Continued)

OTHER PUBLICATIONS

Machine translation of JP-2000188430-A (Year: 2000).*

(Continued)

*Primary Examiner* — Tamir Ayad
(74) *Attorney, Agent, or Firm* — KED & Associates LLP

(57) ABSTRACT

A thermoelectric module according to one embodiment of the present invention comprises: a first metal substrate; a thermoelectric element; and a second metal substrate, wherein the thermoelectric element comprises a first resin layer, a plurality of first electrodes, a plurality of P-type thermoelectric legs and a plurality of N-type thermoelectric legs, a plurality of second electrodes and a second resin layer, wherein the width of the first metal substrate is greater than the width of the second metal substrate, and the first metal substrate comprises a first surface in direct contact with the first resin layer and a second surface opposite to the first surface, and further comprises: a first support spaced apart from the thermoelectric element and a side surface of the second metal substrate on the first surface of the first metal substrate, and arranged so as to surround the thermoelectric element and the side surface of the second metal substrate; and a sealing material spaced apart from the thermoelectric element and the side surface of the second metal substrate, on the first surface of the first metal sub- (Continued)

strate, and arranged so as to surround the thermoelectric element and the side surface of the second metal substrate.

17 Claims, 13 Drawing Sheets

(56) References Cited

U.S. PATENT DOCUMENTS

| | | | | |
|---|---|---|---|---|
| 4,002,497 | A | * | 1/1977 | Brown ................... H01L 35/00 |
| | | | | 136/202 |
| 4,587,810 | A | * | 5/1986 | Fletcher ................... F25C 1/22 |
| | | | | 62/340 |
| 9,735,333 | B2 | * | 8/2017 | Himmer ................... H01L 35/10 |
| 2005/0241690 | A1 | * | 11/2005 | Tajima ................... H01L 35/08 |
| | | | | 136/211 |
| 2013/0061900 | A1 | | 3/2013 | Tachibana |
| 2013/0081663 | A1 | * | 4/2013 | Yang ................... H01L 35/32 |
| | | | | 136/203 |
| 2015/0280097 | A1 | | 10/2015 | Jinushi et al. |

FOREIGN PATENT DOCUMENTS

| | | |
|---|---|---|
| KR | 10-1357731 | 2/2014 |
| KR | 10-2015-0088063 | 7/2015 |
| KR | 10-2018-0078654 | 7/2018 |

OTHER PUBLICATIONS

International Search Report dated Dec. 12, 2019 issued in Application No. PCT/KR2019/011726.
Korean Office Action dated Jun. 24, 2022 issued in Application 10-2018-0108449.

* cited by examiner

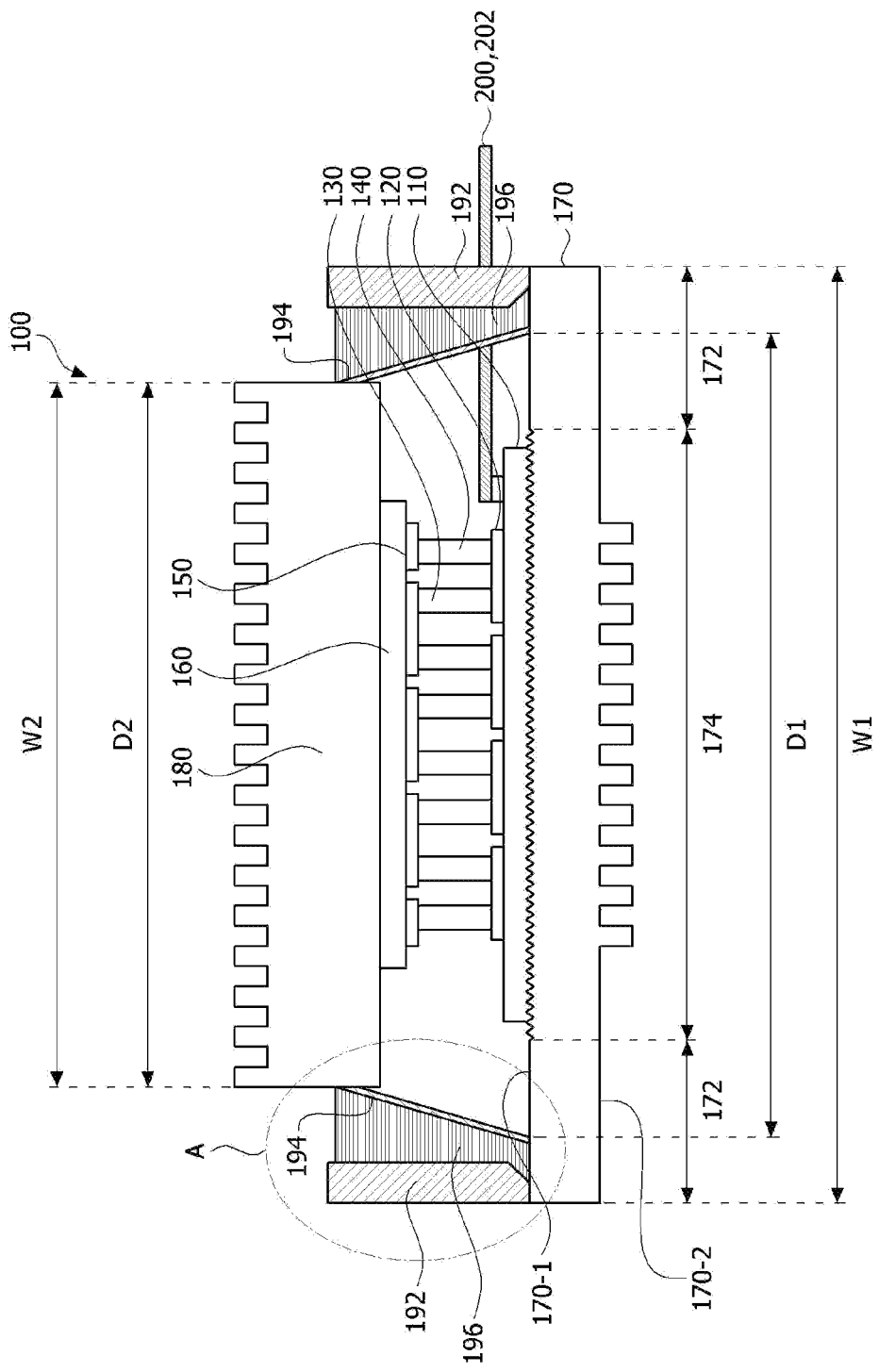
[FIG. 1]

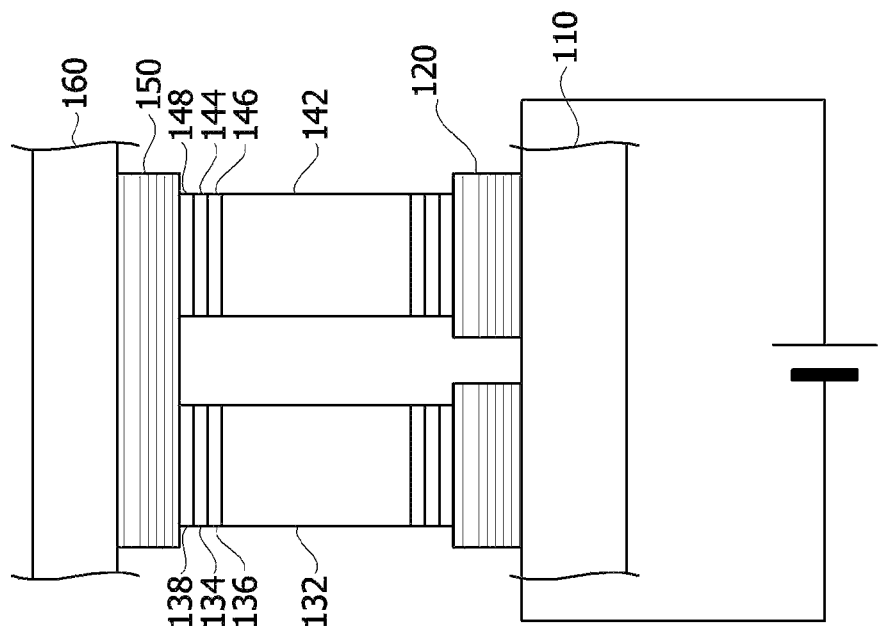
[FIG. 2B]
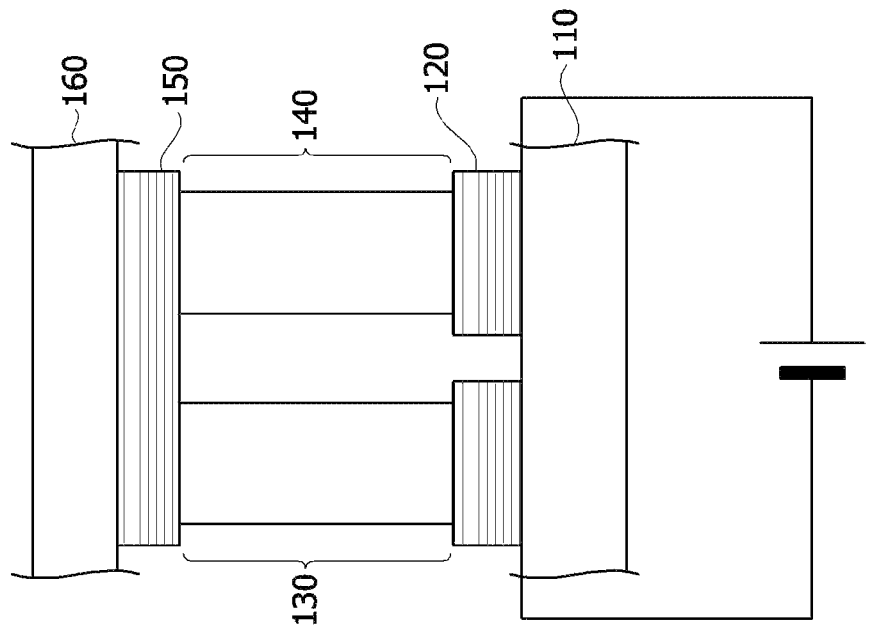
[FIG. 2A]

[FIG. 3]
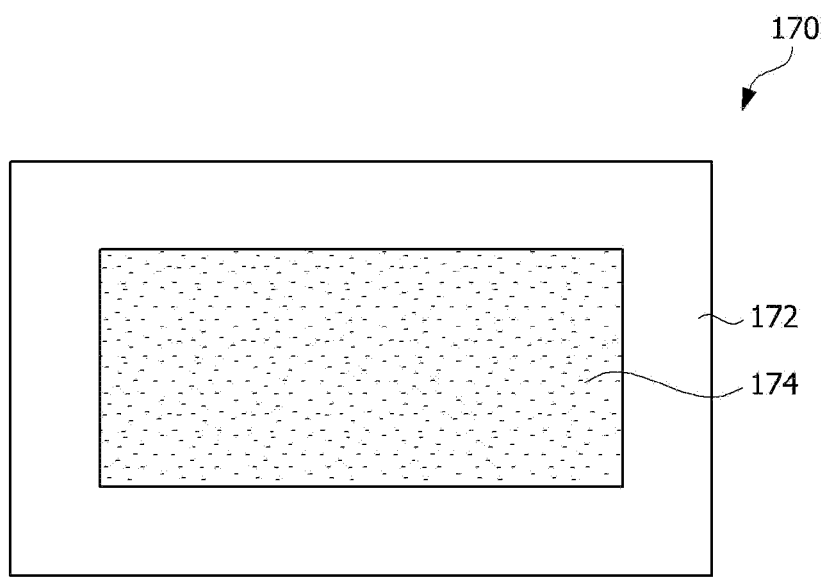
[FIG. 4]
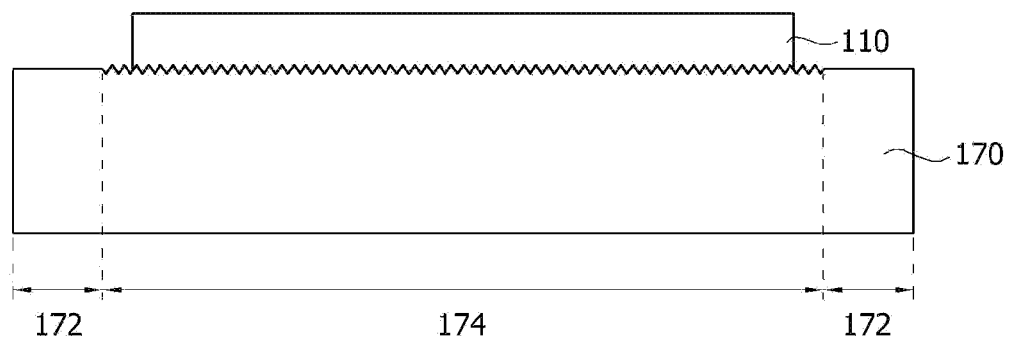

[FIG. 5]
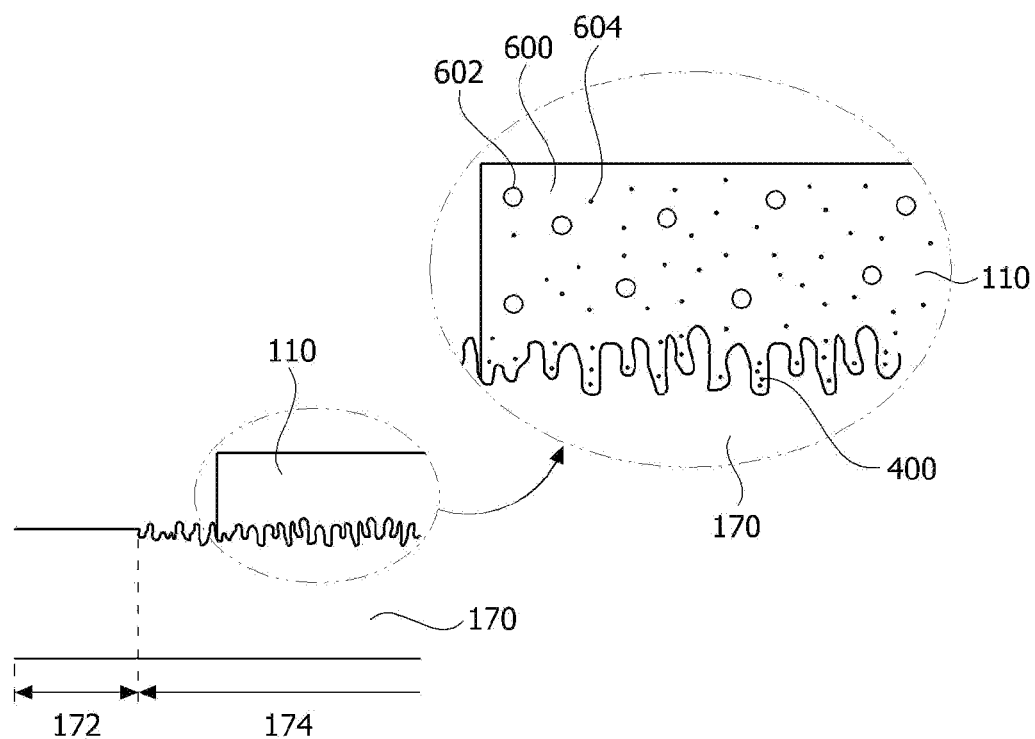

[FIG. 6]
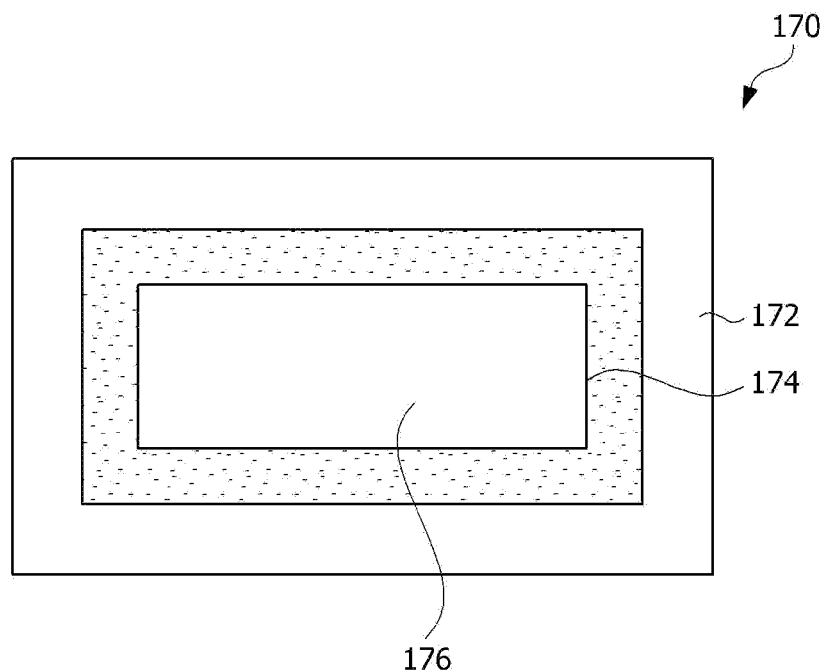
[FIG. 7]
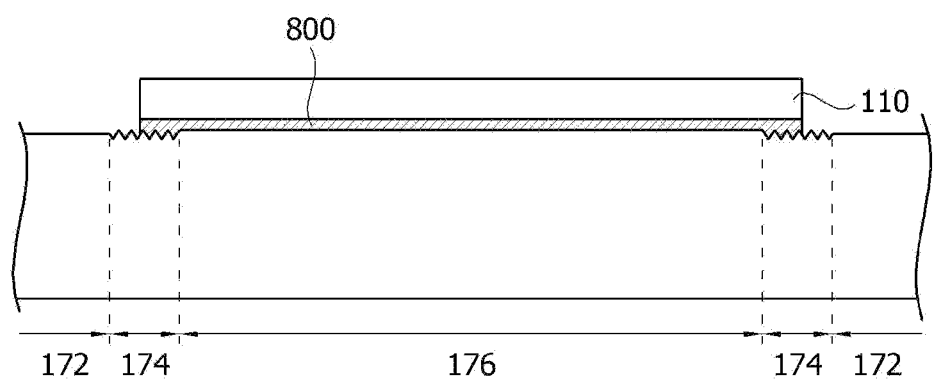

[FIG. 8]
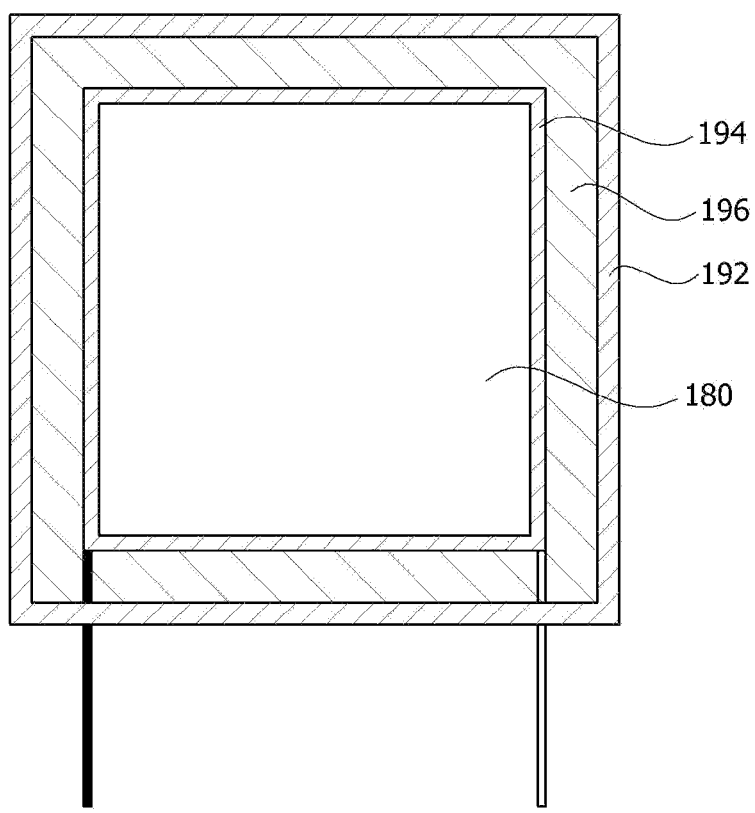

[FIG. 9]
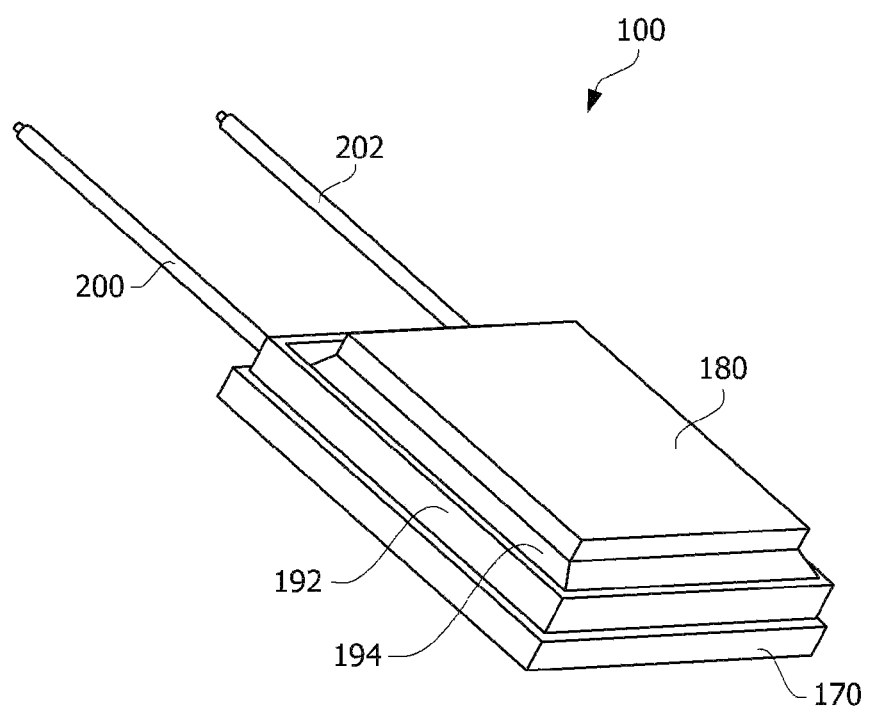

[FIG. 10]
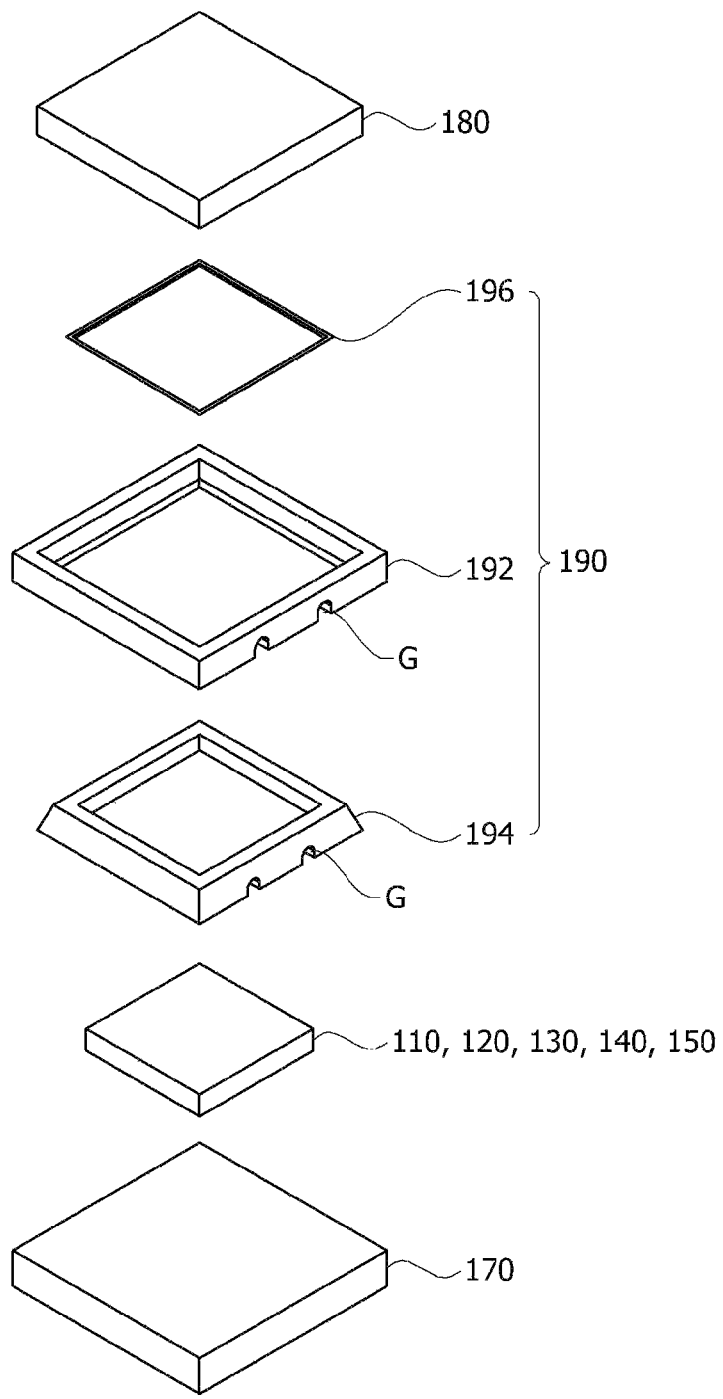

[FIG. 11]
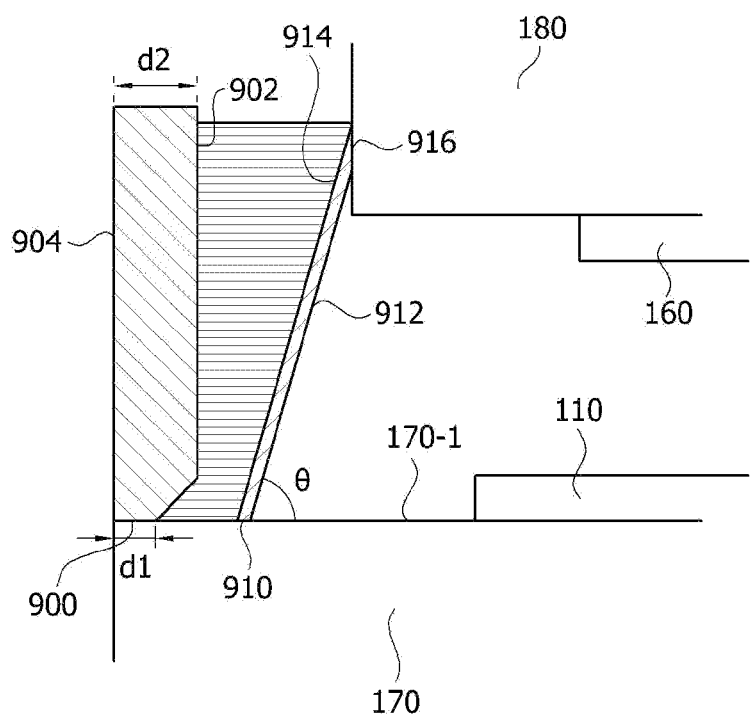
192 : 900, 902, 904
194 : 910, 912, 912, 916

[FIG. 12]
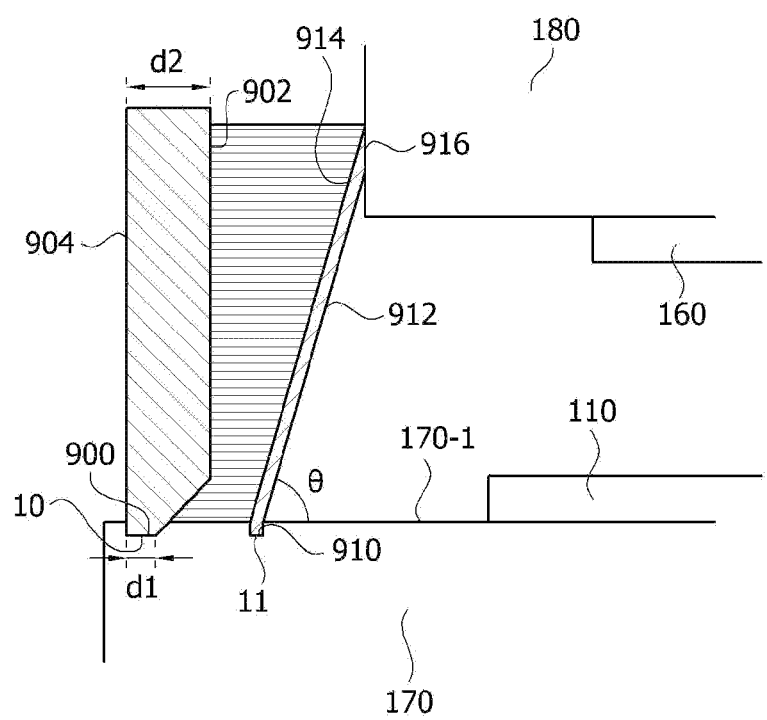
192 : 900, 902, 904
194 : 910, 912, 912, 916

[FIG. 13]
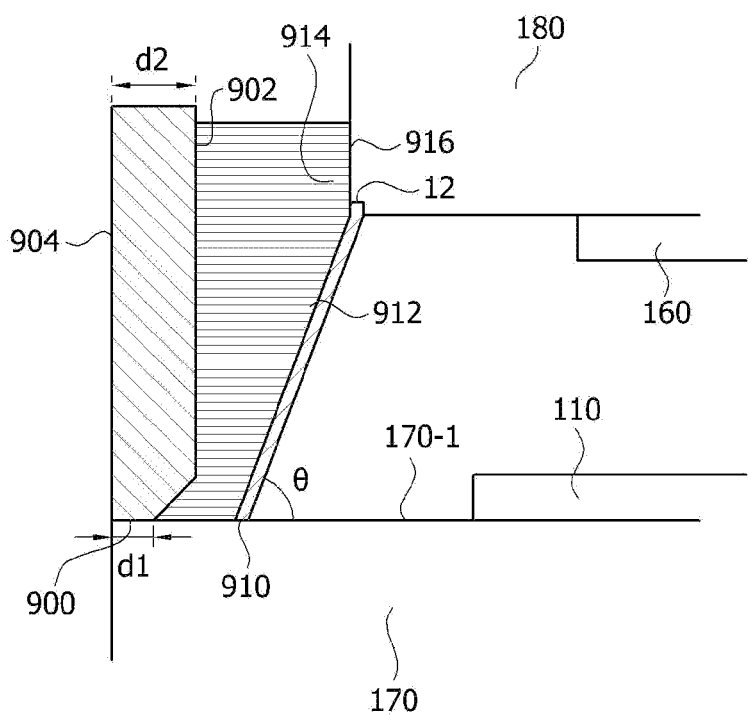
192 : 900, 902, 904
194 : 910, 912, 912, 916

[FIG. 14]
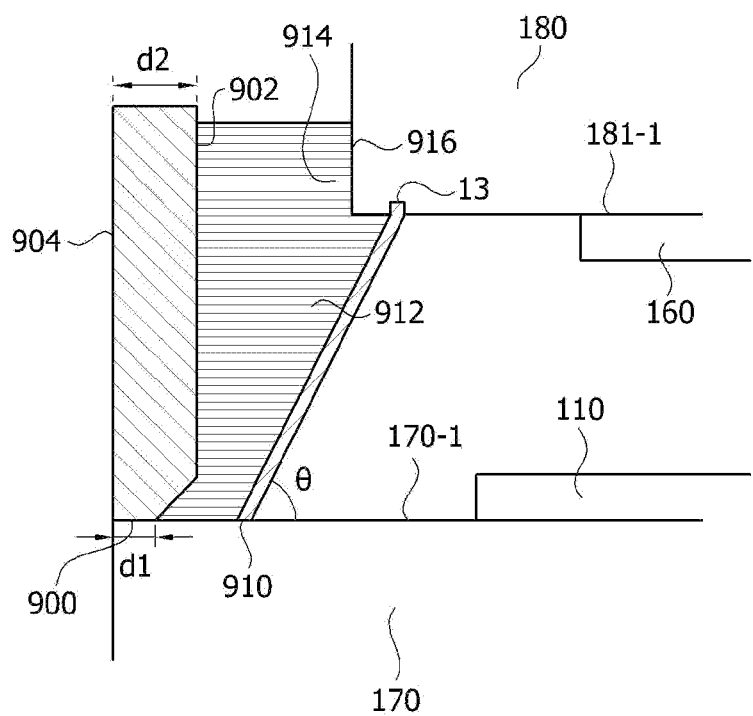
192 : 900, 902, 904
194 : 910, 912, 912, 916

[FIG. 15]
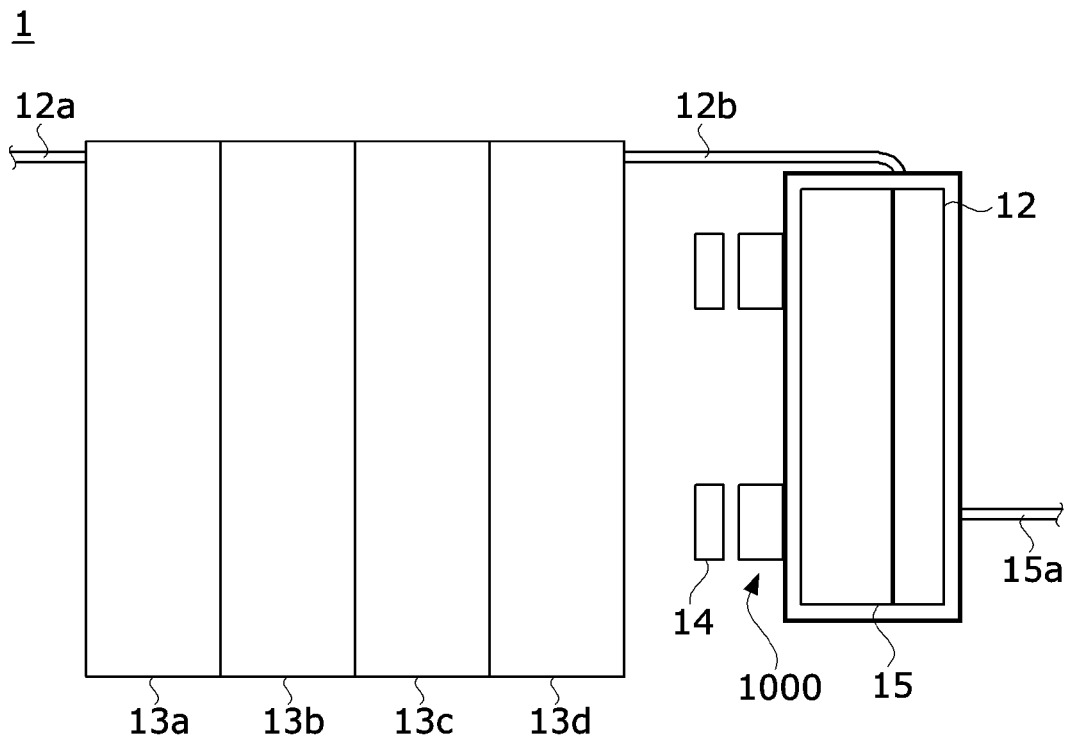
[FIG. 16]
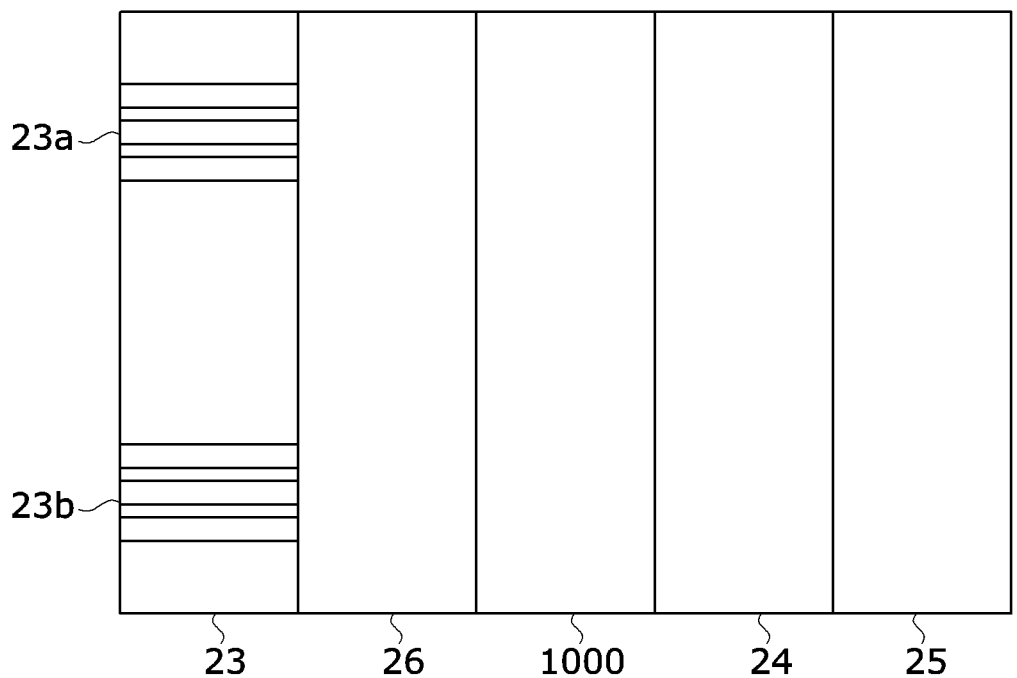

THERMOELECTRIC MODULE

CROSS-REFERENCE TO RELATED PATENT APPLICATIONS

This application is a U.S. National Stage Application under 35 U.S.C. § 371 of PCT Application No. PCT/KR2019/011726, filed Sep. 10, 2019, which claims priority to Korean Patent Application No. 10-2018-0108449, filed Sep. 11, 2018, whose entire disclosures are hereby incorporated by reference.

TECHNICAL FIELD

The present invention relates to a thermoelectric module, and more specifically, to an assembly structure of a thermoelectric module.

BACKGROUND ART

A thermoelectric phenomenon is a phenomenon which occurs due to movement of electrons and holes in a material and refers to direct energy conversion between heat and electricity.

A thermoelectric element is a generic term for a device using the thermoelectric phenomenon and has a structure in which a P-type thermoelectric material and an N-type thermoelectric material are joined between metal electrodes to form a PN junction pair.

Thermoelectric elements can be classified into a device using temperature changes of electrical resistance, a device using the Seebeck effect, which is a phenomenon in which an electromotive force is generated due to a temperature difference, a device using the Peltier effect, which is a phenomenon in which heat absorption or heat generation by current occurs, and the like.

The thermoelectric element includes substrates, electrodes, and thermoelectric legs, wherein a plurality of thermoelectric legs are arranged in an array form between an upper substrate and a lower substrate, a plurality of upper electrodes are arranged between the plurality of thermoelectric legs and the upper substrate, and a plurality of lower electrodes are arranged between the plurality of thermoelectric legs and the lower substrate.

The thermoelectric element is variously applied to home appliances, electronic components, communication components, or the like. For example, the thermoelectric element can be applied to a cooling device, a heating device, a power generation device, or the like. Accordingly, the demand for thermoelectric performance of the thermoelectric element is increasing more and more.

Specifically, the need for slimming, cooling performance, and ease of assembly of the thermoelectric element is increasing.

Meanwhile, in order to protect the electrodes and the thermoelectric legs of the thermoelectric element from external foreign materials or moisture, a side surface of the thermoelectric element should be sealed, and generally, the side surface of the thermoelectric element can be sealed using a sealing material. In this case, since a sealing process is difficult and takes a long time, there is a problem in that a large amount of time and money are required in an entire manufacturing process of the thermoelectric element.

DISCLOSURE

Technical Problem

The present invention is directed to providing a sealing structure of a thermoelectric module.

Technical Solution

One aspect of the present invention provides a thermoelectric module including: a first metal substrate; a thermoelectric element arranged on the first metal substrate; and a second metal substrate arranged on the thermoelectric element, wherein the thermoelectric element includes a first resin layer which is arranged on the first metal substrate and comes into direct contact with the first metal substrate, a plurality of first electrodes arranged on the first resin layer, a plurality of P-type thermoelectric legs and a plurality of N-type thermoelectric legs arranged on the plurality of first electrodes, a plurality of second electrodes arranged on the plurality of P-type thermoelectric legs and the plurality of N-type thermoelectric legs, and a second resin layer arranged on the plurality of second electrodes, a width of the first metal substrate is larger than a width of the second metal substrate, the first metal substrate includes a first surface which comes into direct contact with the first resin layer and a second surface which is a surface opposite the first surface, and the thermoelectric module further includes: a first support spaced apart from the thermoelectric element and a side surface of the second metal substrate on the first surface of the first metal substrate, and arranged so as to surround the thermoelectric element and the side surface of the second metal substrate; a second support arranged on the first surface of the first metal substrate to be spaced apart from the first support and to be surrounded by the first support; and a sealing material arranged between the first support and the second support.

The first support may come into contact with the first surface of the first metal substrate, and the second support may come into contact with the first surface of the first metal substrate and the second metal substrate.

The sealing material may come into contact with an inner circumferential surface of the first support, an outer circumferential surface of the second support, and the first surface arranged between the first support and the second support.

An inner circumferential surface of the second support may include a surface inclined with respect to the first surface.

An inner diameter of the second support in a region which comes into contact with the first metal substrate may be larger than an inner diameter of the first support in a region arranged at a side surface of at least one among the first resin layer, the plurality of first electrodes, the plurality of P-type thermoelectric legs and the plurality of N-type thermoelectric legs, the plurality of second electrodes, the second resin layer, and the second metal substrate.

A thickness of the first support in a region which comes into contact with the first metal substrate may be smaller than a thickness of the first support in a region arranged at a side surface of at least one among the first resin layer, the plurality of first electrodes, the plurality of P-type thermoelectric legs and the plurality of N-type thermoelectric legs, the plurality of second electrodes, the second resin layer, and the second metal substrate.

At least one of a groove configured to accommodate the first support and a groove configured to accommodate the second support may be formed in the first surface of the first metal substrate.

The second support may come into contact with a side surface of the second metal substrate.

A groove configured to accommodate the second support may be formed in the side surface of the second metal substrate.

The second metal substrate may include a third surface which comes into direct contact with the second resin layer and a fourth surface which is a surface opposite the third surface, and the second support may come into contact with the third surface of the second metal substrate.

A groove configured to accommodate the second support may be formed in the third surface.

Advantageous Effects

According to an embodiment of the present invention, a thermoelectric module having excellent thermal conductivity, low thermal loss, and high reliability can be obtained. Specifically, according to the embodiment of the present invention, a thermoelectric element can be sealed through a simple process.

DESCRIPTION OF DRAWINGS

FIG. 1 is a cross-sectional view of a thermoelectric module according to one embodiment of the present invention.

FIGS. 2A and 2B are views for describing a pair of a P-type thermoelectric leg and an N-type thermoelectric leg in a thermoelectric element according to one embodiment of the present invention.

FIGS. 3 to 7 illustrate a bonding structure between a metal substrate and a resin layer of the thermoelectric module according to one embodiment of the present invention.

FIG. 8 is a top view of the thermoelectric module according to one embodiment of the present invention, and illustrates a region on which a sealing material is applied.

FIG. 9 is a perspective view of the thermoelectric module according to one embodiment of the present invention.

FIG. 10 is an exploded perspective view of the thermoelectric module according to one embodiment of the present invention.

FIG. 11 is an enlarged view of region A in FIG. 1.

FIGS. 12 to 14 are various embodiments of region A in FIG. 1.

FIG. 15 is a block diagram of a water purifier to which the thermoelectric element according to the embodiment of the present invention is applied.

FIG. 16 is a block diagram of a refrigerator to which the thermoelectric element according to the embodiment of the present invention is applied.

MODES OF THE INVENTION

Hereinafter, preferred embodiments of the present invention will be described in detail with reference to the accompanying drawings.

However, the technical spirit of the present invention is not limited to some embodiments which will be described and may be embodied in various forms, and one or more elements in the embodiments may be selectively combined and replaced to be used within the scope of the technical spirit of the present invention.

Further, terms used in the embodiments of the present invention (including technical and scientific terms), may be interpreted with meanings that are generally understood by those skilled in the art unless particularly defined and described, and terms which are generally used, such as terms defined in a dictionary, may be understood in consideration of their contextual meanings in the related art.

In addition, terms used in the description are provided not to limit the present invention but to describe the embodiments.

In the specification, the singular form may also include the plural form unless the context clearly indicates otherwise and may include one or more of all possible combinations of A, B, and C when disclosed as at least one (or one or more) of "A, B, and C".

In addition, terms such as first, second, A, B, (a), (b), and the like may be used to describe elements of the embodiments of the present invention.

The terms are only provided to distinguish the elements from other elements, and the essence, sequence, order, or the like of the elements are not limited by the terms.

Further, when particular elements are disclosed as being "connected," "coupled," or "linked" to other elements, the elements may include not only a case of being directly connected, coupled, or linked to other elements but also a case of being connected, coupled, or linked to other elements by elements between the elements and other elements.

In addition, when one element is disclosed as being formed "on or under" another element, the term "on or under" includes both a case in which the two elements are in direct contact with each other and a case in which at least another element is disposed between the two elements (indirectly). Further, when the term "on or under" is expressed, a meaning of not only an upward direction but also a downward direction may be included based on one element.

FIG. 1 is a cross-sectional view of a thermoelectric module according to one embodiment of the present invention, and FIG. 2 is a view for describing a pair of a P-type thermoelectric leg and an N-type thermoelectric leg in a thermoelectric element according to one embodiment of the present invention.

Referring to FIGS. 1 and 2, a thermoelectric element 100 includes a first resin layer 110, a plurality of first electrodes 120, a plurality of P-type thermoelectric legs 130, a plurality of N-type thermoelectric legs 140, a plurality of second electrodes 150, and a second resin layer 160.

The plurality of first electrodes 120 are arranged between the first resin layer 110 and lower surfaces of the plurality of P-type thermoelectric legs 130 and the plurality of N-type thermoelectric legs 140, and the plurality of second electrodes 150 are arranged between the second resin layer 160 and upper surfaces of the plurality of P-type thermoelectric legs 130 and the plurality of N-type thermoelectric legs 140. Accordingly, the plurality of P-type thermoelectric legs 130 and the plurality of N-type thermoelectric legs 140 are electrically connected by the plurality of first electrodes 120 and the plurality of second electrodes 150. One pair of the P-type thermoelectric leg 130 and the N-type thermoelectric leg 140 which are arranged between the first electrode 120 and the second electrode 150 and electrically connected to each other may form a unit cell.

One pair of the P-type thermoelectric leg 130 and the N-type thermoelectric leg 140 may be arranged on each first electrode 120, and one pair of the P-type thermoelectric leg 130 and the N-type thermoelectric leg 140 may be arranged on each second electrode 150 so that one of one pair of the P-type thermoelectric leg 130 and the N-type thermoelectric leg 140 arranged on each first electrode 120 overlaps the second electrode 150.

Here, the P-type thermoelectric leg 130 and the N-type thermoelectric leg 140 may be bismuth-telluride (Bi—Te)-based thermoelectric legs including bismuth (Bi) and tellurium (Te) as main raw materials. The P-type thermoelectric leg 130 may be a thermoelectric leg including a bismuth-telluride (Bi—Te)-based main raw material in an amount of 99 to 99.999 wt % including at least one among antimony (Sb), nickel (Ni), aluminum (Al), copper (Cu), silver (Ag), lead (Pb), boron (B), gallium (Ga), tellurium (Te), bismuth (Bi), and indium (In), and a mixture in an amount of 0.001 to 1 wt % including Bi or Te based on 100 wt % of the total weight. For example, the main raw material may be Bi—Se—Te, and Bi or Te may be further included in an amount of 0.001 to 1 wt % of the total weight. The N-type thermoelectric leg 140 may be a thermoelectric leg including a bismuth-telluride (Bi—Te)-based main raw material in an amount of 99 to 99.999 wt % including at least one among selenium (Se), nickel (Ni), aluminum (Al), copper (Cu), silver (Ag), lead (Pb), boron (B), gallium (Ga), tellurium (Te), bismuth (Bi), and indium (In), and a mixture in an amount of 0.001 to 1 wt % including Bi or Te based on 100 wt % of the total weight. For example, the main raw material may be Bi—Sb—Te, and Bi or Te may be further included in an amount of 0.001 to 1 wt % of the total weight.

The P-type thermoelectric legs 130 and the N-type thermoelectric legs 140 may be formed in a bulk type or a stacked type. Generally, the bulk type P-type thermoelectric legs 130 or the bulk type N-type thermoelectric legs 140 may be obtained through a process of producing an ingot by heat-treating a thermoelectric material, pulverizing and sieving the ingot to obtain powder for thermoelectric legs, sintering the powder, and cutting the sintered object. The stacked type P-type thermoelectric legs 130 or the stacked type N-type thermoelectric legs 140 may be obtained through a process of forming a unit member by applying a paste including a thermoelectric material on a sheet-shaped base material, and then stacking and cutting the unit member.

In this case, one pair of the P-type thermoelectric leg 130 and the N-type thermoelectric leg 140 may have the same shape and volume or may have different shapes and volumes. For example, since electrical conduction characteristics of the P-type thermoelectric leg 130 and the N-type thermoelectric leg 140 are different, a height or cross-sectional area of the N-type thermoelectric leg 140 may be formed differently from a height or cross-sectional area of the P-type thermoelectric leg 130.

The performance of the thermoelectric element according to one embodiment of the present invention may be expressed as a thermoelectric performance index. The thermoelectric performance index (ZT) may be expressed as in Equation 1.

$$ZT=\alpha^2 \cdot \sigma \cdot T/k \quad \text{[Equation 1]}$$

Here, $\alpha$ is the Seebeck coefficient [V/K], $\sigma$ is electrical conductivity [S/m], and $\alpha^2\sigma$ is a power factor [W/mK2]). Further, T is a temperature, and k is thermal conductivity [W/mK]. k may be expressed as $\alpha \cdot cp \cdot \rho$, wherein a is thermal diffusivity [cm2/S], cp is specific heat [J/gK], and $\rho$ is density [g/cm3].

In order to obtain the thermoelectric performance index of the thermoelectric element, a Z value (V/K) is measured using a Z meter, and the thermoelectric performance index (ZT) may be calculated using the measured Z value.

According to another embodiment of the present invention, the P-type thermoelectric legs 130 and the N-type thermoelectric legs 140 may have a structure shown in FIG. 2B. Referring to FIG. 2B, the thermoelectric legs 130 and 140 include thermoelectric material layers 132 and 142, first plated layers 134-1 and 144-1 stacked on one surfaces of the thermoelectric material layers 132 and 142, second plated layers 134-2 and 144-2 stacked on the other surfaces arranged opposite the one surfaces of the thermoelectric material layers 132 and 142, first bonding layers 136-1 and 146-1 and second bonding layers 136-2 and 146-2 respectively arranged between the thermoelectric material layers 132 and 142 and the first plated layers 134-1 and 144-1 and between the thermoelectric material layers 132 and 142 and the second plated layers 134-2 and 144-2, and first metal layers 138-1 and 148-1 and second metal layers 138-2 and 148-2 respectively stacked on the first plated layers 134-1 and 144-1 and the second plated layers 134-2 and 144-2.

In this case, the thermoelectric material layers 132 and 142 and the first bonding layers 136-1 and 146-1 may come into direct contact with each other, and the thermoelectric material layers 132 and 142 and the second bonding layers 136-2 and 146-2 may come into direct contact with each other. Further, the first bonding layers 136-1 and 146-1 and the first plated layers 134-1 and 144-1 may come into direct contact with each other, and the second bonding layers 136-2 and 146-2 and the second plated layers 134-2 and 144-2 may come into direct contact with each other. In addition, the first plated layers 134-1 and 144-1 and the first metal layers 138-1 and 148-1 may come into direct contact with each other, and the second plated layers 134-2 and 144-2 and the second metal layers 138-2 and 148-2 may come into direct contact with each other.

Here, the thermoelectric material layers 132 and 142 may include bismuth (Bi) and tellurium (Te), which are semiconductor materials. The thermoelectric material layers 132 and 142 may have the same material or shape as the P-type thermoelectric legs 130 or the N-type thermoelectric legs 140 shown in FIGS. 1 and 2A.

Further, the first metal layers 138-1 and 148-1 and the second metal layers 138-2 and 148-2 may be selected from copper (Cu), a copper alloy, aluminum (Al) and an aluminum alloy, and may each have a thickness of 0.1 to 0.5 mm, and preferably, 0.2 to 0.3 mm. Since coefficients of thermal expansion of the first metal layers 138-1 and 148-1 and the second metal layers 138-2 and 148-2 are similar to or greater than those of the thermoelectric material layers 132 and 142, compressive stress is applied at interfaces between the first metal layers 138-1 and 148-1 and the second metal layers 138-2 and 148-2, and the thermoelectric material layers 132 and 142 during sintering, and thus cracks or peeling may be prevented. Further, since a bonding force between the first metal layers 138-1 and 148-1 and the second metal layers 138-2 and 148-2, and the electrodes 120 and 150 is high, the thermoelectric legs 130 and 140 may be stably coupled to the electrodes 120 and 150.

Next, the first plated layers 134-1 and 144-1 and the second plated layers 134-2 and 144-2 may each include at least one of Ni, Sn, Ti, Fe, Sb, Cr, and Mo, and may have a thickness of 1 to 20 μm, and preferably 1 to 10 μm. Since the first plated layers 134-1 and 144-1 and the second plated layers 134-2 and 144-2 prevent a reaction between Bi or Te which is a semiconductor material in the thermoelectric material layers 132 and 142, and the first metal layers 138-1 and 148-1 and the second metal layers 138-2 and 148-2, performance degradation of the thermoelectric element may be prevented, and oxidation of the first metal layers 138-1 and 148-1 and the second metal layers 138-2 and 148-2 may be prevented.

In this case, the first bonding layers 136-1 and 146-1 and the second bonding layers 136-2 and 146-2 may be respectively arranged between the thermoelectric material layers 132 and 142 and the first plated layers 134-1 and 144-1 and between the thermoelectric material layers 132 and 142 and the second plated layers 134-2 and 144-2. In this case, the first bonding layers 136-1 and 146-1 and the second bonding layers 136-2 and 146-2 may include Te. For example, the first bonding layers 136-1 and 146-1 and the second bonding layers 136-2 and 146-2 may include at least one among Ni—Te, Sn—Te, Ti—Te, Fe—Te, Sb—Te, Cr—Te, and Mo—Te. According to the embodiment of the present invention, the first bonding layers 136-1 and 146-1 and the second bonding layers 136-2 and 146-2 may each have a thickness of 0.5 to 100 μm, and preferably, 1 to 50 μm. According to the embodiment of the present invention, the first bonding layers 136-1 and 146-1 and the second bonding layers 136-2 and 146-2 including Te may be arranged between the thermoelectric material layers 132 and 142, and the first plated layers 134-1 and 144-1 and the second plated layers 134-2 and 144-2 in advance to prevent the diffusion of Te in the thermoelectric material layers 132 and 142 to the first plated layers 134-1 and 144-1 and the second plated layers 134-2 and 144-2. Accordingly, it is possible to prevent the generation of a Bi-rich region.

Accordingly, a Te content is higher than a Bi content from center portions of the thermoelectric material layers 132 and 142 to interfaces between the thermoelectric material layers 132 and 142 and the first bonding layers 136-1 and 146-1, and a Te content is higher than a Bi content from the center portions of the thermoelectric material layers 132 and 142 to interfaces between the thermoelectric material layers 132 and 142 and the second bonding layers 136-2 and 146-2. The Te content from the center portions of the thermoelectric material layers 132 and 142 to interfaces between the thermoelectric material layers 132 and 142 and the first bonding layers 136-1 and 146-1 or the Te content from the center portions of the thermoelectric material layers 132 and 142 to interfaces between the thermoelectric material layers 132 and 142 and the second bonding layers 136-2 and 146-2 may be 0.8 to 1 times the Te content in the center portions of the thermoelectric material layers 132 and 142. For example, the Te content within a thickness of 100 μm from the interfaces between the thermoelectric material layers 132 and 142 and the first bonding layers 136-1 and 146-1 in directions toward the center portions of the thermoelectric material layers 132 and 142 may be 0.8 to 1 times the Te content in the center portions of the thermoelectric material layers 132 and 142. Here, the Te content may be uniformly maintained within the thickness of 100 μm from the interfaces between the thermoelectric material layers 132 and 142 and the first bonding layers 136-1 and 146-1 in the directions toward the center portions of the thermoelectric material layers 132 and 142, and for example, a change rate of a Te weight ratio within the thickness of 100 μm from the interfaces between the thermoelectric material layers 132 and 142 and the first bonding layers 136-1 and 146-1 in the directions toward the center portions of the thermoelectric material layers 132 and 142 may be 0.9 to 1.

Further, a Te content in the first bonding layers 136-1 and 146-1 or the second bonding layers 136-2 and 146-2 may be the same as or similar to a Te content in the thermoelectric material layers 132 and 142. For example, the Te content in the first bonding layers 136-1 and 146-1 or the second bonding layers 136-2 and 146-2 may be 0.8 to 1 times, preferably, 0.85 to 1 times, more preferably, 0.9 to 1 times, and more preferably, 0.95 to 1 times the Te content in the thermoelectric material layers 132 and 142. Here, the content may be a weight ratio. For example, when the Te content in the thermoelectric material layers 132 and 142 is included at 50 wt %, the Te content in the first bonding layers 136-1 and 146-1 or the second bonding layers 136-2 and 146-2 may be 40 to 50 wt %, preferably, 42.5 to 50 wt %, more preferably, 45 to 50 wt %, and more preferably, 47.5 to 50 wt %. Further, the Te content in the first bonding layers 136-1 and 146-1 or the second bonding layers 136-2 and 146-2 may be greater than an Ni content. In the first bonding layers 136-1 and 146-1 or the second bonding layers 136-2 and 146-2, the Te content is uniformly distributed, but the Ni content may decrease while being adjacent in directions toward the thermoelectric material layers 132 and 142 in the first bonding layers 136-1 and 146-1 or the second bonding layers 136-2 and 146-2.

Further, a Te content from the interfaces between the thermoelectric material layers 132 and 142 and the first bonding layers 136-1 and 146-1 or the interfaces between the thermoelectric material layers 132 and 142 and the second bonding layers 136-2 and 146-2 to interfaces between the first plated layers 136-1 and 146-1 and the first bonding layers 136-1 and 146-1 or interfaces between the second plated layers 134-2 and 144-2 and the second bonding layers 136-2 and 146-2 may be uniformly distributed. For example, a change rate of a Te weight ratio from the interfaces between the thermoelectric material layers 132 and 142 and the first bonding layers 136-1 and 146-1 or the interfaces between the thermoelectric material layers 132 and 142 and the second bonding layers 136-2 and 146-2 to the interfaces between the first plated layers 136-1 and 146-1 and the first bonding layers 136-1 and 146-1 or the interfaces between the second plated layers 134-2 and 144-2 and the second bonding layers 136-2 and 146-2 may be 0.8 to 1. Here, the Te content from the interfaces between the thermoelectric material layers 132 and 142 and the first bonding layers 136-1 and 146-1 or the interfaces between the thermoelectric material layers 132 and 142 and the second bonding layers 136-2 and 146-2 to the interfaces between the first plated layers 136-1 and 146-1 and the first bonding layers 136-1 and 146-1 or the interfaces between the second plated layers 134-2 and 144-2 and the second bonding layers 136-2 and 146-2 may be uniformly distributed as the change rate of the Te weight ratio becomes closer to 1.

Further, the Te content at surfaces in the first bonding layers 136-1 and 146-1 which come into contact with the first plated layers 134-1 and 144-1, that is, the interfaces between the first plated layers 134-1 and 144-1 and the first bonding layers 136-1 and 146-1 or surfaces in the second bonding layers 136-2 and 146-2 which come into contact with the second plated layers 134-2 and 144-2, that is, the interfaces between the second plated layers 134-2 and 144-2 and the second bonding layers 136-2 and 146-2 may be 0.8 to 1 times, preferably, 0.85 to 1 times, more preferably, 0.9 to 1 times, and more preferably, 0.95 to 1 times the Te content at surfaces in the thermoelectric material layers 132 and 142 which come into contact with the first bonding layers 136-1 and 146-1, that is, the interfaces between the thermoelectric material layers 132 and 142 and the first bonding layers 136-1 and 146-1 or surfaces in the thermoelectric material layers 132 and 142 which come into contact with the second bonding layers 136-2 and 146-2, that is, the interfaces between the thermoelectric material layers 132 and 142 and the second bonding layers 136-2 and 146-2. Here, the content may be a weight ratio.

Further, it can be seen that the Te content in the center portions of the thermoelectric material layers 132 and 142 is the same as or similar to the Te content at the interfaces between the thermoelectric material layers 132 and 142 and the first bonding layers 136-1 and 146-1 or the interfaces between the thermoelectric material layers 132 and 142 and the second bonding layers 136-2 and 146-2. That is, the Te content at the interfaces between the thermoelectric material layers 132 and 142 and the first bonding layers 136-1 and 146-1 or the interfaces between the thermoelectric material layers 132 and 142 and the second bonding layers 136-2 and 146-2 may be 0.8 to 1 times, preferably, 0.85 to 1 times, more preferably, 0.9 to 1 times, and more preferably, 0.95 to 1 times the Te content at the center portions of the thermoelectric material layers 132 and 142. Here, the content may be a weight ratio. Here, the center portions of the thermoelectric material layers 132 and 142 may refer to surrounding regions including centers of the thermoelectric material layers 132 and 142. Further, the interface may refer to the interface itself, or may refer to the interface and surrounding regions of the interface adjacent to the interface within a predetermined distance.

In addition, the Te content in the first plated layers 136-1 and 146-1 or the second plated layers 134-2 and 144-2 may be smaller than the Te content in the thermoelectric material layers 132 and 142 and the Te content in the first bonding layers 136-1 and 146-1 or the second bonding layers 136-2 and 146-2.

In addition, it can be seen that a Bi content in the center portions of the thermoelectric material layers 132 and 142 is the same as or similar to a Bi content at the interfaces between the thermoelectric material layers 132 and 142 and the first bonding layers 136-1 and 146-1 or the interfaces between the thermoelectric material layers 132 and 142 and the second bonding layers 136-2 and 146-2. Accordingly, since the Te content is greater than the Bi content from the center portions of the thermoelectric material layers 132 and 142 to the interfaces between the thermoelectric material layers 132 and 142 and the first bonding layers 136-1 and 146-1 or the interfaces between the thermoelectric material layers 132 and 142 and the second bonding layers 136-2 and 146-2, a section in which the Bi content overtakes the Te content is not present around the interfaces between the thermoelectric material layers 132 and 142 and the first bonding layers 136-1 and 146-1 or the interfaces between the thermoelectric material layers 132 and 142 and the second bonding layers 136-2 and 146-2. For example, the Bi content in the center portions of the thermoelectric material layers 132 and 142 may be 0.8 to 1 times, preferably, 0.85 to 1 times, more preferably, 0.9 to 1 times, and more preferably, 0.95 to 1 times the Bi content at the interfaces between the thermoelectric material layers 132 and 142 and the first bonding layers 136-1 and 146-1 or the interfaces between the thermoelectric material layers 132 and 142 and the second bonding layers 136-2 and 146-2. Here, the content may be a weight ratio.

Here, the plurality of first electrodes 120 arranged between the first resin layer 110, and the P-type thermoelectric legs 130 and the N-type thermoelectric legs 140, and the plurality of second electrodes 150 arranged between the second resin layer 160, and the P-type thermoelectric legs 130 and the N-type thermoelectric legs 140 may include at least one among copper (Cu), silver (Ag) and nickel (Ni).

Further, the first resin layer 110 and the second resin layer 160 may be formed to have different sizes. For example, a volume, a thickness, or an area of one of the first resin layer 110 and the second resin layer 160 may be formed to be larger than a volume, a thickness, or an area of the other one. Accordingly, it is possible to increase the heat absorption performance or heat dissipation performance of the thermoelectric element.

In this case, the P-type thermoelectric leg 130 or the N-type thermoelectric leg 140 may have a cylindrical shape, a polygonal pillar shape, an oval pillar shape, or the like.

Alternatively, the P-type thermoelectric leg 130 or the N-type thermoelectric leg 140 may have a stacked structure. For example, the P-type thermoelectric leg 130 or the N-type thermoelectric leg 140 may be formed using a method of stacking a plurality of structures in which a semiconductor material is applied on a sheet-shaped base material and then cutting the structures. Accordingly, material loss may be prevented and electrical conduction characteristics may be enhanced.

Alternatively, the P-type thermoelectric leg 130 or the N-type thermoelectric leg 140 may be manufactured according to a zone melting method or a powder sintering method. According to the zone melting method, the thermoelectric leg is obtained through a method of manufacturing an ingot using a thermoelectric material, refining so that particles are rearranged in a single direction by slowly applying heat to the ingot, and slowly cooling the ingot. According to the powder sintering method, the thermoelectric leg is obtained through a process of manufacturing an ingot using a thermoelectric material, pulverizing and sieving the ingot to obtain powder for thermoelectric legs, and sintering the powder.

According to the embodiment of the present invention, the first resin layer 110 may be arranged on a first metal substrate 170, and a second metal substrate 180 may be arranged on the second resin layer 160. The thermoelectric module according to the embodiment of the present invention may include the first metal substrate 170, the thermoelectric element 100, and the second metal substrate 180.

The first metal substrate 170 and the second metal substrate 180 may be formed of aluminum, an aluminum alloy, copper, a copper alloy, or the like. The first metal substrate 170 and the second metal substrate 180 may support the thermoelectric element 100, that is, the first resin layer 110, the plurality of first electrodes 120, the plurality of P-type thermoelectric legs 130, the plurality of N-type thermoelectric legs 140, the plurality of second electrodes 150, the second resin layer 160, and the like, and may be regions directly attached to an application to which the thermoelectric element 100 according to the embodiment of the present invention is applied. Accordingly, the first metal substrate 170 and the second metal substrate 180 may be interchanged with a first metal support and a second metal support, respectively.

An area of the first metal substrate 170 may be larger than an area of the first resin layer 110, and an area of the second metal substrate 180 may be larger than an area of the second resin layer 160. That is, the first resin layer 110 may be arranged in a region spaced apart from an edge of the first metal substrate 170 by a predetermined distance, and the second resin layer 160 may be arranged in a region spaced apart from an edge of the second metal substrate 180 by a predetermined distance.

The first resin layer 110 and the second resin layer 160 may be formed of an epoxy resin composition including an epoxy resin and an inorganic filler. Here, the inorganic filler may be included at 68 to 88 vol % of the epoxy resin composition. When the inorganic filler is included in an amount less than 68 vol %, a heat conduction effect may be low, and when the inorganic filler is included in an amount greater than 88 vol %, adhesion between the resin layer and the metal substrate may be lowered, and the resin layer may be easily broken.

Thicknesses of the first resin layer 110 and the second resin layer 160 may each be 0.02 to 0.6 mm, preferably, 0.1 to 0.6 mm, and more preferably, 0.2 to 0.6 mm, and thermal conductivity may be 1 W/mK or more, preferably, 10 W/mK or more, and more preferably, 20 W/mK or more.

The epoxy resin may include an epoxy compound and a curing agent. In this case, the curing agent may be included in a volume ratio of 1 to 10 based on a volume ratio of 10 of the epoxy compound. Here, the epoxy compound may include at least one of a crystalline epoxy compound, an amorphous epoxy compound, and a silicone epoxy compound. The crystalline epoxy compound may include a mesogen structure. A mesogen is a basic unit of liquid crystal, and includes a rigid structure. Further, the amorphous epoxy compound may be a general amorphous epoxy compound having two or more epoxy groups in a molecule, and may be, for example, glycidyl ethers derived from bisphenol A or bisphenol F. Here, the curing agent may include at least one of an amine-based curing agent, a phenolic curing agent, an acid anhydride-based curing agent, a polymercaptan-based curing agent, a polyaminoamide-based curing agent, an isocyanate-based curing agent, and a block isocyanate curing agent, and two or more types of the curing agents may be mixed and used.

The inorganic filler may include an oxide or a nitride, and the nitride may be included in an amount of 55 to 95 wt % of the inorganic filler, and more preferably, 60 to 80 wt %. When the nitride is included in this numerical range, thermal conductivity and bonding strength may be enhanced. Here, the oxide may include at least one of aluminum oxide, titanium oxide, and zinc oxide, and the nitride may include at least one of boron nitride and aluminum nitride. Here, when the nitride includes boron nitride, the boron nitride may be applied in a shape of a boron nitride agglomerate in which a plate-shaped boron nitride is agglomerated, and a surface of the boron nitride agglomerate may be coated with a polymer having the following Unit 1, or at least some of voids in the boron nitride aggregate may be filled by the polymer having the following Unit 1.

Unit 1 is as follows.

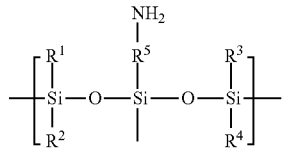

Here, one of R1, R2, R3 and R4 may be H, and the others may be selected from the group consisting of C1-C3 alkyls, C2-C3 alkenes, and C2-C3 alkynes, and R5 may be a linear, branched or cyclic divalent organic linker having 1 to 12 carbon atoms.

In one embodiment, one of the remainder among R1, R2, R3 and R4 except for H may be selected from C2-C3 alkenes, and another and still another of the remainder may be selected from C1-C3 alkyls. For example, the polymer resin according to the embodiment of the present invention may include the following Unit 2.

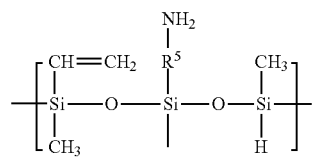

Alternatively, the remainder among R1, R2, R3 and R4 except for H may be selected from the group consisting of C1-C3 alkyls, C2-C3 alkenes, and C2-C3 alkynes to be different from each other.

Like the above, when the polymer according to Unit 1 or Unit 2 is coated on the boron nitride agglomerate in which the plate-shaped boron nitride is agglomerated and fills at least some of the voids in the boron nitride agglomerate, an air layer in the boron nitride agglomerate is minimized to increase heat conduction performance of the boron nitride agglomerate, and breakage of the boron nitride aggregate may be prevented by increasing a bonding force between the plate-shaped boron nitride. Further, when a coating layer is formed on the boron nitride agglomerate in which the plate-shaped boron nitride is aggregated, forming a functional group becomes easy, and when a functional group is formed on the coating layer of the boron nitride agglomerate, affinity with the resin may increase.

In this case, a particle size (D50) of the boron nitride agglomerate may be 250 to 350 µm, and a particle size (D50) of the aluminum oxide may be 10 to 30 µm. When the particle size (D50) of the boron nitride agglomerate and the particle size (D50) of the aluminum oxide satisfy these numerical ranges, the boron nitride agglomerate and the aluminum oxide may be uniformly dispersed in the epoxy resin composition, and accordingly, it is possible to have a uniform heat conduction effect and adhesion performance throughout the resin layer. However, the present invention is not limited thereto, and at least one of the first resin layer 110 and the second resin layer 160 may be replaced with a ceramic substrate.

Alternatively, at least one of the first resin layer 110 and the second resin layer 160 may be a silicone resin composition including a silicone resin and an inorganic filler, and the silicone resin may include, for example, polydimethylsiloxane (PDMS).

Although not shown, at least one of the first resin layer 110 and the second resin layer 160 may be formed as a plurality of layers. In this case, each of the plurality of layers may be formed by including a resin composition or an inorganic filler which is the same or different from each other, and the layers may have different thicknesses. Accordingly, it is possible to further enhance at least one of an insulating property, bonding strength, and heat conduction performance of at least one of the first resin layer 110 and the second resin layer 160.

FIGS. 3 to 7 illustrate a bonding structure between a metal substrate and a resin layer of the thermoelectric module according to one embodiment of the present invention. For convenience of description, the first metal substrate 170 and the first resin layer 110 will be described as examples, but the same structure may be applied between the second metal substrate 180 and the second resin layer 160.

Referring to FIGS. 3 to 5, a surface on which the first resin layer 110 is arranged among both surfaces of the first metal substrate 170, that is, a surface facing the first resin layer 110 among both surfaces of the first metal substrate 170, may include a first region 172 and a second region 174, and the second region 174 may be arranged in the first region 172. That is, the first region 172 may be arranged within a predetermined distance from an edge of the first metal substrate 170 toward a center region, and the first region 172 may surround the second region 174.

In this case, a surface roughness of the second region 174 may be larger than a surface roughness of the first region 172, and the first resin layer 110 may be arranged on the second region 174. Here, the first resin layer 110 may be arranged to be spaced apart by a predetermined distance from a boundary between the first region 172 and the second region 174. That is, the first resin layer 110 may be arranged on the second region 174, and the edge of the first resin layer 110 may be located in the second region 174. Accordingly, in at least some of grooves 400 formed by the surface roughness of the second region 174, a portion of the first resin layer 110, that is, an epoxy resin 600 and a portion 604 of the inorganic filler included in the first resin layer 110 may permeate, and adhesion between the first resin layer 110 and the first metal substrate 170 may increase.

However, the surface roughness of the second region 174 may be larger than the particle size (D50) of a portion of the inorganic filler included in the first resin layer 110 and smaller than the particle size (D50) of the other portion of the inorganic filler. Here, the particle size (D50) may refer to a particle diameter corresponding to 50% of a weight percentage in a particle size distribution curve, that is, a particle diameter at which a passing mass percentage becomes 50%, and may be interchanged with an average particle diameter. In an example in which the first resin layer 110 includes aluminum oxide and boron nitride as inorganic fillers, the aluminum oxide does not affect the adhesion performance between the first resin layer 110 and the first metal substrate 170, but the boron nitride has a smooth surface, and thus the adhesion performance between the first resin layer 110 and the first metal substrate 170 may be adversely affected. Accordingly, when the surface roughness of the second region 174 is formed to be larger than the particle size (D50) of the aluminum oxide included in the first resin layer 110, and smaller than the particle size (D50) of the boron nitride, since only the aluminum oxide is arranged in the grooves formed by the surface roughness of the second region 174, and the boron nitride may not be arranged in the grooves, the first resin layer 110 and the first metal substrate 170 may maintain high bonding strength.

Accordingly, the surface roughness of the second region 174 may be 1.05 to 1.5 times the particle size (D50) of an inorganic filler 604 having a relatively small size among the inorganic fillers included in the first resin layer 110, for example, the aluminum oxide, and may be 0.04 to 0.15 times the particle size (D50) of an inorganic filler 602 having a relatively large size among the inorganic fillers included in the first resin layer 110, for example, the boron nitride.

As described above, when the particle size (D50) of the boron nitride agglomerate is 250 to 350 μm, and the particle size (D50) of the aluminum oxide is 10 to 30 μm, the surface roughness of the second region 174 may be 1 to 50 μm. Accordingly, in the grooves formed by the surface roughness of the second region 174, only the aluminum oxide may be arranged, and the boron nitride agglomerate may not be arranged.

Accordingly, contents of the epoxy resin and the inorganic filler in the grooves formed by the surface roughness of the second region 174 may be different from contents of the epoxy resin and the inorganic filler in a middle region between the first metal substrate 170 and the plurality of first electrodes 120.

The surface roughness may be measured using a surface roughness meter. The surface roughness meter may measure a cross-sectional curve using a probe, and calculate the surface roughness using a peak line, a valley bottom line, an average line, and a reference length of the cross-sectional curve. In this specification, the surface roughness may refer to an arithmetic average roughness (Ra) by a center line average calculation method. The arithmetic average roughness (Ra) may be obtained through the following Equation 2.

$$R_a = \frac{1}{L}\int_0^L |f(x)|dx \qquad \text{[Equation 2]}$$

That is, when the cross-sectional curve obtained by the probe of the surface roughness meter is extracted as much as a reference length L and expressed as the function (f(x)) with an average line direction set to an x-axis and a height direction set to a y-axis, the value obtained by Equation 2 may be expressed in micrometers.

Referring to FIGS. 6 and 7, the surface on which the first resin layer 110 is arranged among both surfaces of the first metal substrate 170, that is, the surface facing the first resin layer 110 among both surfaces of the first metal substrate 170 may include the first region 172 and the second region 174 surrounded by the first region 172 and having a larger surface roughness than the first region 172, and may further include a third region 176.

Here, the third region 176 may be arranged in the second region 174. That is, the third region 176 may be arranged to be surrounded by the second region 174. Further, the surface roughness of the second region 174 may be formed larger than a surface roughness of the third region 176.

In this case, the first resin layer 110 may be arranged to be spaced apart from a boundary between the first region 172 and the second region 174 by a predetermined distance, and may be arranged to cover a part of the second region 174 and the third region 176.

In order to increase the bonding strength between the first metal substrate 170 and the first resin layer 110, an adhesion layer 800 may be further arranged between the first metal substrate 170 and the first resin layer 110.

The adhesive layer 800 may be the same epoxy resin composition as an epoxy resin composition forming the first resin layer 110. For example, after applying the same epoxy resin composition as the epoxy resin composition forming the first resin layer 110 in an uncured state between the first metal substrate 170 and the first resin layer 110, the first metal substrate 170 and the first resin layer 110 may be bonded to each other in a method of stacking the first resin layer 110 in a cured state, and then pressing the first resin layer 110 at a high temperature.

In this case, a part of the adhesive layer 800, for example, a part of the epoxy resin of the epoxy resin composition constituting the adhesive layer 800 and a part of the inorganic filler may be arranged in at least some of the grooves in the second region 174 according to the surface roughness.

FIG. 8 is a top view of the thermoelectric module according to one embodiment of the present invention, and illustrates a region on which a sealing material is applied, FIG. 9 is a perspective view of the thermoelectric module according to one embodiment of the present invention, FIG. 10 is an exploded perspective view of the thermoelectric module according to one embodiment of the present invention, and FIG. 11 is an enlarged view of region A in FIG. 1.

Referring to FIG. 1 and FIGS. 8 to 11, a width W1 of the first metal substrate 170 is larger than a width W2 of the second metal substrate 180, and the first metal substrate 170 includes a first surface 170-1 which comes into direct contact with the first resin layer 110 and a second surface 170-2 which is a surface opposite the first surface 170-1.

In order to seal the thermoelectric element 100 according to one embodiment of the present invention, the thermoelectric module further includes a sealing part 190.

The sealing part 190 may be arranged on the first metal substrate 170 from the first metal substrate 170 to the second metal substrate 180, and may be arranged to surround a side surface of the thermoelectric element 100, for example, a side surface of the first resin layer 110, the outermost side of the plurality of first electrodes 120, the outermost side of the outermost of the plurality of P-type thermoelectric legs 130 and the plurality of N-type thermoelectric legs 140, the outermost side of the plurality of second electrodes 150, and a side surface of the second resin layer 160. Accordingly, the thermoelectric element 100, that is, the first resin layer 110, the plurality of first electrodes 120, the plurality of P-type thermoelectric legs 140, the plurality of second electrodes 150, and the second resin layer 160 may be sealed from external moisture, heat, and contamination.

The sealing part 190 may include a first support 192, a second support 194, and a sealing material 196.

The first support 192 is arranged on the first surface 170-1 of the first metal substrate 170 to come into contact with the first surface 170-1 of the first metal substrate 170. The first support 192 is arranged to be spaced apart from the side surface of the thermoelectric element 100, for example, the side surfaces of the first resin layer 110, the plurality of first electrodes 120, the plurality of P-type thermoelectric legs 130 and the plurality of N-type thermoelectric legs 140, the plurality of second electrodes 150, and the second resin layer 160, and a side surface of the second metal substrate 180, and to surround the side surface of the thermoelectric element 100, for example, the side surfaces of first resin layer 110, the plurality of first electrodes 120, the plurality of P-type thermoelectric legs 130 and the plurality of N-type thermoelectric legs 140, the plurality of second electrodes 150, and the second resin layer 160, and at least some of the side surface of the second metal substrate 180. That is, the first support 192 may be arranged on the first surface 170-1 of the first metal substrate 170 to be spaced apart from the side surface of the first resin layer 110, the outermost side of the plurality of first electrodes 120, the outermost side of the plurality of P-type thermoelectric legs 130 and the plurality of N-type thermoelectric legs 140, the outermost side of the plurality of second electrodes 150, the side surface of the second resin layer 160, and at least some of the side surface of the second metal substrate 180, by a predetermined distance.

The second support 194 may be arranged on the first surface 170-1 of the first metal substrate 170 to come into contact with the first surface 170-1 of the first metal substrate 170, to be spaced apart from the first support 192, to be surrounded by the first support 192, and to come into contact with the second metal substrate 180.

To this end, the first support 192 may have a frame shape which accommodates the first resin layer 110, the plurality of first electrodes 120, the plurality of P-type thermoelectric legs 130 and the plurality of N-type thermoelectric legs 140, the plurality of second electrodes 150, and the second resin layer 160, and at least some of the second metal substrate 180, and may include a first contact surface 900 which comes into contact with the first surface 170-1 of the first metal substrate 170, a first inner circumferential surface 902 arranged to face the first resin layer 110, the plurality of first electrodes 120, the plurality of P-type thermoelectric legs 130 and the plurality of N-type thermoelectric legs 140, the plurality of second electrodes 150, and the second resin layer 160, and at least some of the second metal substrate 180, and a first outer circumferential surface 904 arranged to face the outside of the thermoelectric element 100.

Further, the second support 194 may have a frame shape which accommodates the first resin layer 110, the plurality of first electrodes 120, the plurality of P-type thermoelectric legs 130 and the plurality of N-type thermoelectric legs 140, the plurality of second electrodes 150, and the second resin layer 160, and at least some of the second metal substrate 180, and may include a second contact surface 910 which comes into contact with the first surface 170-1 of the first metal substrate 170, a second inner circumferential surface 912 arranged to face the first resin layer 110, the plurality of first electrodes 120, the plurality of P-type thermoelectric legs 130 and the plurality of N-type thermoelectric legs 140, the plurality of second electrodes 150, and the second resin layer 160, and at least some of the second metal substrate 180, a second outer circumferential surface 914 arranged to face the outside of the thermoelectric element 100, and a third contact surface 916 which comes into contact with the second metal substrate 180.

Here, guide grooves G for drawing out wires 200 and 202 connected to the electrodes may be formed in the first support 192 and the second support 194. To this end, each of the first support 192 and the second support 194 may be an injection molded product formed of plastic or the like, and may be interchanged with a sealing case or a sealing cover. Here, each of the first support 192 and the second support 194 is illustrated as having a quadrangular shape, but is not limited thereto, and the first support 192 and the second support 194 may be variously modified to a polygonal shape, a circular shape, and the like.

Further, the sealing material 196 may be arranged between the first support 192 and the second support 194. The sealing material 196 may include at least one of an epoxy resin and a silicone resin. The sealing material 196 may be filled in a space formed by the outer circumferential surface 914 of the second support 194, the first surface 170-1 of the first metal substrate 170, and the inner circumferential surface 902 of the first support 192, and may serve to airtightly seal the first support 192, the first metal substrate 170, and the second support 194. The sealing material 196 may increase a sealing effect of the first resin layer 110, the plurality of first electrodes 120, the plurality of P-type thermoelectric legs 130, the plurality of N-type thermoelectric legs 140, the plurality of second electrodes 150, the second resin layer 160, and may be interchanged with a finishing material, a finishing layer, a waterproofing material, a waterproofing layer, and the like.

As shown in the embodiment of the present invention, when the sealing part 190 includes the first support 192 and the second support 194, and a space between the first support 192 and the second support 194 is filled with the sealing material 196, since a process of applying the sealing material 196 needs to be performed only once, time and costs required when the sealing material 196 is applied may be significantly reduced. Further, since the sealing material 196 is filled between the first support 192 and the second support 194, it is possible to prevent a problem in that the surface of the metal substrate is stained with the sealing material.

Meanwhile, the inner circumferential surface 912 of the second support 194 may include a surface inclined with respect to the first surface 170-1 of the first metal substrate 170 (at 0°<θ<90°, preferably, 15°<θ<85°, and more preferably 30°<θ<80°). That is, an inner diameter D1 of the second support 194 in a region which comes into contact with the first metal substrate 170 may be larger than an inner diameter D2 of the second support 194 in a region arranged at the side surface of at least one of the first resin layer 110, the plurality of first electrodes 120, the plurality of P-type thermoelectric legs 130 and the plurality of N-type thermoelectric legs 140, the plurality of second electrodes 150, the second resin layer 160, and the second metal substrate 180. When the second support 194 has this structure, since it is possible to stably support between the first metal substrate 170 and the second metal substrate 180, and a contact area between the outer circumferential surface 914 of the second support 194 and the sealing material 196 may be increased while minimizing an amount of the sealing material 196 to be applied, sealing strength may be increased.

Further, a thickness d1 of the first support 192 in the region which comes into contact with the first metal substrate 170 may be smaller than a thickness d2 of the first support 192 in the region arranged at the side surface of at least one of the first resin layer 110, the plurality of first electrodes 120, the plurality of P-type thermoelectric legs 130 and the plurality of N-type thermoelectric legs 140, the plurality of second electrodes 150, the second resin layer 160, and the second metal substrate 180. Accordingly, since a contact area between the inner circumferential surface 902 of the first support 192 and the sealing material 196 and a contact area between the first surface 170-1 of the first metal substrate 170 and the sealing material 196 may be increased, sealing strength may be increased.

In this case, the thickness d1 of the first support 192 in the region which comes into contact with the first metal substrate 170 may be 0.2 times or more the maximum thickness of the thickness d2 of the first support 192 in the region arranged at the side surface of at least one of the first resin layer 110, the plurality of first electrodes 120, the plurality of P-type thermoelectric legs 130 and the plurality of N-type thermoelectric legs 140, the plurality of second electrodes 150, the second resin layer 160, and the second metal substrate 180. Outside of this numerical range, since the support strength between the first support 192 and the first surface 170-1 of the first metal substrate 170 is weakened, the sealing material 196 may flow out of the first support 192.

FIGS. 12 to 14 are various embodiments of region A in FIG. 1.

Referring to FIG. 12, at least one of a groove 10 which accommodates the first support 192 and a groove 11 which accommodates the second support 194 may be formed in the first surface 170-1 of the first metal substrate 170. Accordingly, the first support 192 and the second support 194 may be more stably fixed to the first surface 170-1 of the first metal substrate 170, and a problem in that the sealing material 196 leaks out of the space between the first support 192 and the second support 194 may be prevented.

Referring to FIG. 13, the second support 194 may come into contact with the side surface of the second metal substrate 180, and a groove 12 which accommodates the second support 194 may be formed in the side surface of the second metal substrate 180. Accordingly, the second support 194 may be stably fixed to the side surface of the second metal substrate 180.

In the embodiments of FIGS. 12 and 13, in order to be accommodated in the grooves 10, 11, and 12 formed in the first and second metal substrates 170 and 180, the first contact surface 900 of the first support 192, and the second contact surface 910 and the third contact surface 916 of the second support 194 may be injection-molded according to shapes of the grooves 10, 11, and 12.

Referring to FIG. 14, the second metal substrate 180 may include a third surface 180-1 which comes into direct contact with the second resin layer 160 and a fourth surface 180-2 which is a surface opposite the third surface, and the second support 194 may come into contact with the third surface 180-1 of the second metal substrate 180. To this end, a groove 13 which accommodates the second support 194 may be formed in the third surface 180-1. Accordingly, the second support 194 may be stably fixed to the second metal substrate 180.

Hereinafter, with reference to FIG. 15, an example in which the thermoelectric element according to the embodiment of the present invention is applied to a water purifier will be described.

FIG. 15 is a block diagram of the water purifier to which the thermoelectric element according to the embodiment of the present invention is applied.

A water purifier 1 to which the thermoelectric element according to the embodiment of the present invention is applied includes a raw water supply pipe 12*a*, a purified water tank inlet pipe 12*b*, a purified water tank 12, a filter assembly 13, a cooling fan 14, a heat storage tank 15, a cold water supply pipe 15*a*, and a thermoelectric device 1000.

The raw water supply pipe 12*a* is a supply pipe which introduces water to be purified into the filter assembly 13 from a water source, the purified water tank inlet pipe 12*b* is an inlet pipe which introduces the purified water from the filter assembly 13 into the purified water tank 12, and the cold water supply pipe 15*a* is a supply pipe through which cold water cooled to a predetermined temperature by the thermoelectric device 1000 in the purified water tank 12 is finally supplied to a user.

The purified water tank 12 temporarily accommodates the purified water to store the water purified through the filter assembly 13 and introduced through the purified water tank inlet pipe 12*b* and supply the water to the outside.

The filter assembly 13 is composed of a precipitation filter 13*a*, a pre-carbon filter 13*b*, a membrane filter 13*c*, and a post-carbon filter 13*d*.

That is, the water introduced into the raw water supply pipe 12*a* may be purified through the filter assembly 13.

The heat storage tank 15 is arranged between the purified water tank 12 and the thermoelectric device 1000 to store cold air generated in the thermoelectric device 1000. The cold air stored in the heat storage tank 15 is applied to the purified water tank 12 to cool the water accommodated in the purified water tank 120.

The heat storage tank 15 may come into surface contact with the purified water tank 12 so that the cold air may be smoothly transferred.

As described above, the thermoelectric device 1000 includes a heat absorbing surface and a heating surface, and has one side which is cooled and the other side which is heated by the movement of electrons on a P-type semiconductor and an N-type semiconductor.

Here, the one side may be the purified water tank 12 side and the other side may be an opposite side of the purified water tank 12.

Further, as described above, the thermoelectric device 1000 has excellent waterproofing and dustproofing performance, and improved heat flow performance, and thus may efficiently cool the purified water tank 12 in the water purifier.

Hereinafter, with reference to FIG. 16, an example in which the thermoelectric element according to the embodiment of the present invention is applied to a refrigerator will be described.

FIG. 16 is a block diagram of the refrigerator to which the thermoelectric element according to the embodiment of the present invention is applied.

The refrigerator includes a deep temperature evaporation chamber cover 23 in a deep temperature evaporation chamber, an evaporation chamber partition wall 24, a main evaporator 25, a cooling fan 26, and a thermoelectric device 1000.

The inside of the refrigerator is partitioned into a deep temperature storage chamber and the deep temperature evaporation chamber by the deep temperature evaporation chamber cover 23.

Specifically, an inner space corresponding to the front of the deep temperature evaporation chamber cover 23 may be defined as the deep temperature storage chamber, and an inner space corresponding to the rear of the deep temperature evaporation chamber cover 23 may be defined as the deep temperature evaporation chamber.

A discharge grill 23a and a suction grill 23b may be formed on a front surface of the deep temperature evaporation chamber cover 23.

The evaporation chamber partition wall 24 is installed at a point spaced frontward from a rear wall of an inner cabinet, and partitions a space in which the deep temperature storage system is located and a space in which the main evaporator 25 is located.

The cold air cooled by the main evaporator 25 is supplied to a freezing chamber and then returns to the main evaporator side.

The thermoelectric device 1000 is accommodated in the deep temperature evaporation chamber, and has a structure in which the heat absorbing surface faces a drawer assembly of the deep temperature storage chamber, and the heating surface faces the evaporator. Accordingly, a heat absorbing phenomenon generated by the thermoelectric device 1000 may be used to quickly cool food stored in the drawer assembly to a super low temperature state of minus 50° C. or less.

Further, as described above, the thermoelectric device 1000 has excellent waterproofing and dustproofing performance, and improved heat flow performance, and thus may efficiently cool the drawer assembly in the refrigerator.

The thermoelectric element according to the embodiment of the present invention may be applied to a device for power generation, a device for cooling, a device for heating, and the like. Specifically, the thermoelectric element according to the embodiment of the present invention may be mainly applied to an optical communication module, a sensor, a medical device, a measuring device, aerospace industry, a refrigerator, a chiller, an automobile ventilation sheets, a cup holder, a washing machine, a dryer, a wine cellar, a water purifier, a power supply device for a sensor, a thermopile, and the like. Alternatively, the thermoelectric element according to the embodiment of the present invention may be applied to a power generation device which generates electricity using waste heat generated from an engine of a vehicle, a ship, or the like.

Here, as an example in which the thermoelectric element according to the embodiment of the present invention is applied to a medical device, there is a polymerase chain reaction (PCR) device. The PCR device is a device for amplifying deoxyribonucleic acid (DNA) to determine a nucleotide sequence of DNA, and demands precise temperature control and requires a thermal cycle. To this end, a Peltier-based thermoelectric element may be applied.

As another example in which the thermoelectric element according to the embodiment of the present invention is applied to the medical device, there is a photodetector. Here, the photodetector includes an infrared/ultraviolet ray detector, a charge coupled device (CCD) sensor, an X-ray detector, a thermoelectric thermal reference source (TTRS), and the like. The Peltier-based thermoelectric element may be applied for cooling the photodetector. Accordingly, it is possible to prevent a wavelength change, an output decrease, a resolution decrease, or the like due to a temperature increase in the photodetector.

As still another example in which the thermoelectric element according to the embodiment of the present invention is applied to the medical device, there is an immunoassay field, an in vitro diagnostics field, a general temperature control and cooling system, a physical therapy field, a liquid chiller system, a blood/plasma temperature control field, or the like. Accordingly, precise temperature control is possible.

As yet another example in which the thermoelectric element according to the embodiment of the present invention is applied to the medical device, there is an artificial heart. Accordingly, power may be supplied to the artificial heart.

As an example in which the thermoelectric element according to the embodiment of the present invention is applied to the aerospace industry, there is a star tracking system, a thermal imaging camera, an infrared/ultraviolet detector, a CCD sensor, a Hubble space telescope, a TTRS, or the like. Accordingly, it is possible to maintain a temperature of an image sensor.

As another example in which the thermoelectric element according to the embodiment of the present invention is applied to the aerospace industry, there is a cooling device, a heater, a power generation device, or the like.

In addition, the thermoelectric element according to the embodiment of the present invention may be applied to other industrial fields for power generation, cooling, and heating.

Although preferable embodiments of the present invention are described above, those skilled in the art may variously modify and change the present invention within the scope of the spirit and area of the present invention disclosed in the claims which will be described below.

The invention claimed is:

1. A thermoelectric module comprising:
a first metal substrate;
a thermoelectric element arranged on the first metal substrate; and
a second metal substrate arranged on the thermoelectric element,
wherein the thermoelectric element includes a first resin layer which is arranged on the first metal substrate and comes into direct contact with the first metal substrate, a plurality of first electrodes arranged on the first resin layer, a plurality of P-type thermoelectric legs and a plurality of N-type thermoelectric legs arranged on the plurality of first electrodes, a plurality of second electrodes arranged on the plurality of P-type thermoelectric legs and the plurality of N-type thermoelectric legs, and a second resin layer arranged on the plurality of second electrodes, a width of the first metal substrate is larger than a width of the second metal substrate, the first metal substrate includes a first surface which comes into direct contact with the first resin layer and a second surface which is a surface opposite the first surface, and wherein the first surface of the first metal substrate faces the first resin layer in a first direction, and the second surface of the first metal substrate faces away from the first metal substrate in a second direction which is opposite to the first direction, wherein the thermoelectric module further comprises:
a first support spaced apart from the thermoelectric element and a side surface of the second metal substrate on the first surface of the first metal substrate, and arranged so as to surround the thermoelectric element and the side surface of the second metal substrate, wherein the first surface of the first metal substrate faces the first support in the first direction such that the first surface is between the second surface and the first support in the first direction;

a second support arranged on the first surface of the first metal substrate to be spaced apart from the first support and to be surrounded by the first support, wherein the first surface of the first metal substrate faces the second support in the first direction such that the first surface is between the second surface and the second support in the first direction; and a sealing material arranged between the first support and the second support such that the sealing material is between the first support and the second support in a third direction which is traverse to the first direction, wherein the sealing material comes into direct contact with an inner circumferential surface of the first support, an outer circumferential surface of the second support, and the first surface arranged between the first support and the second support, wherein the second support is disposed to extend from the first surface of the first metal substrate to the second metal substrate, and wherein an inner circumferential surface of the second support includes a surface inclined at an angle of 15° to 85° with respect to the first surface.

2. The thermoelectric module of claim 1, wherein:
the first support comes into contact with the first surface of the first metal substrate.

3. The thermoelectric module of claim 2, wherein an inner diameter of the second support in a region which comes into contact with the first metal substrate is larger than an inner diameter of the second support in a region arranged at a side surface of at least one among the first resin layer, the plurality of first electrodes, the plurality of P-type thermoelectric legs and the plurality of N-type thermoelectric legs, the plurality of second electrodes, the second resin layer, and the second metal substrate.

4. The thermoelectric module of claim 2, wherein a thickness of the first support in a region which comes into contact with the first metal substrate is smaller than a thickness of the first support in a region arranged at a side surface of at least one among the first resin layer, the plurality of first electrodes, the plurality of P-type thermoelectric legs and the plurality of N-type thermoelectric legs, the plurality of second electrodes, the second resin layer, and the second metal substrate.

5. The thermoelectric module of claim 2, wherein at least one of a groove configured to accommodate the first support and a groove configured to accommodate the second support is formed in the first surface of the first metal substrate.

6. The thermoelectric module of claim 2, wherein the second support comes into contact with a side surface of the second metal substrate.

7. The thermoelectric module of claim 6, wherein a groove configured to accommodate the second support is formed in the side surface of the second metal substrate.

8. The thermoelectric module of claim 2, wherein:
the second metal substrate includes a third surface which comes into direct contact with the second resin layer and a fourth surface which is a surface opposite the third surface; and
the second support comes into contact with the third surface of the second metal substrate.

9. The thermoelectric module of claim 8, wherein a groove configured to accommodate the second support is formed in the third surface of the second metal substrate.

10. The thermoelectric module of claim 1, wherein guide grooves for drawing out wires connected to the thermoelectric element is formed in the first support and the second support.

11. The thermoelectric module of claim 1, wherein the sealing material includes at least one of an epoxy resin and a silicone resin.

12. The thermoelectric module of claim 1, wherein the inner circumferential surface of the second support includes the surface inclined at an angle of 30° to 80° with respect to the first surface.

13. The thermoelectric module of claim 4, wherein the thickness of the first support in the region which comes into contact with the first metal substrate is at least 0.2 times the thickness of the first support in the region arranged at the side surface of at least one among the first resin layer, the plurality of first electrodes, the plurality of P-type thermoelectric legs and the plurality of N-type thermoelectric legs, the plurality of second electrodes, the second resin layer, and the second metal substrate.

14. The thermoelectric module of claim 1, wherein each of the first support and the second support is an injection molded product.

15. The thermoelectric module of claim 1, wherein the first surface of the first metal substrate include a first region and a second region arranged in the first region, a surface roughness of the second region is larger than a surface roughness of the first region, and the first resin layer is arranged on the second region.

16. The thermoelectric module of claim 15, wherein the first resin layer is arranged to be spaced apart by a predetermined distance from a boundary between the first region and the second region, and the second support is arranged on the first region.

17. The thermoelectric module of claim 1, wherein at least one of the first resin layer and the second resin layer includes a plurality of layers.

* * * * *